United States Patent
Yang et al.

(10) Patent No.: US 7,027,324 B2
(45) Date of Patent: Apr. 11, 2006

(54) METHOD AND SYSTEM FOR PROVIDING COMMON READ AND WRITE WORD LINES FOR A SEGMENTED WORD LINE MRAM ARRAY

(75) Inventors: Hsu Kai (Karl) Yang, Pleasanton, CA (US); Xizeng Shi, Fremont, CA (US); Po-Kang Wang, San Jose, CA (US); Bruce Yee Yang, Pleasanton, CA (US)

(73) Assignees: Headway Technologies, Inc., Milpitas, CA (US); Applied Spintronics Technology, Inc., Milpitas, CA (US)

( * ) Notice: Subject to any disclaimer, the term of this patent is extended or adjusted under 35 U.S.C. 154(b) by 0 days.

(21) Appl. No.: 10/865,722

(22) Filed: Jun. 9, 2004

(65) Prior Publication Data

US 2005/0276098 A1  Dec. 15, 2005

(51) Int. Cl.
*G11C 11/00* (2006.01)
(52) U.S. Cl. .......................... 365/158; 365/55
(58) Field of Classification Search ................ 365/158, 365/171, 213, 232, 66, 50
See application file for complete search history.

(56) References Cited

U.S. PATENT DOCUMENTS

| | | | |
|---|---|---|---|
| 5,565,695 A * | 10/1996 | Johnson | ................ 365/145 |
| 5,587,943 A | 12/1996 | Torok et al. | |
| 6,335,890 B1 | 1/2002 | Reohr et al. | |
| 6,490,217 B1 | 12/2002 | DeBrosse et al. | |
| 6,552,932 B1 | 4/2003 | Cernea | |
| 6,594,191 B1 | 7/2003 | Lammers et al. | |
| 6,657,916 B1 | 12/2003 | Honigschmid et al. | |
| 6,665,205 B1 | 12/2003 | Lee et al. | |
| 6,870,761 B1 * | 3/2005 | Johnson | ................ 365/158 |
| 2003/0123281 A1 | 7/2003 | Iwata et al. | |
| 2005/0087785 A1 * | 4/2005 | Lu | ................ 257/295 |

* cited by examiner

Primary Examiner—Thong Q. Le
(74) Attorney, Agent, or Firm—Sawyer Law Group LLP

(57) ABSTRACT

A method and system for providing a magnetic memory including magnetic memory cells associated with a word line segment is disclosed. The magnetic memory cell includes a magnetic storage device and an isolation device. The isolation device is coupled to the magnetic tunneling junction and with a combined word line for reading and writing to the magnetic memory cell. The magnetic storage device and the isolation device are configured such that no direct current path to ground exists during the writing to the magnetic memory cell. In one aspect, in a write mode, the combined word line associated with the word line segment and the word line segment are activated. In the read mode, at least a portion of the memory cells associated with the word line segment are selected using the combined word line.

21 Claims, 6 Drawing Sheets

METHOD AND SYSTEM FOR PROVIDING COMMON READ AND WRITE WORD LINES FOR A SEGMENTED WORD LINE MRAM ARRAY

FIELD OF THE INVENTION

The present invention relates to magnetic memories, and more particularly to a method and system for providing common read and write word lines in an MRAM.

BACKGROUND OF THE INVENTION

Thin-film magnetic random access memories (MRAM) are of interest because of their potential application to nonvolatile and volatile memories. In a conventional MRAM, the magnetic storage cell typically includes a magnetic tunneling junction (MTJ) stack having a free layer, an insulating tunneling barrier layer, and a pinned layer. Use of a conventional MTJ stack makes it possible to design an MRAM cell with high integration density, high speed, low read power, and soft error rate (SER) immunity.

A conventional MRAM also includes bit lines and word lines, which are generally orthogonal. Note that the names of the conventional conductive lines are interchangeable. Other names, such as row line, column line, digit line, and data line, may also be used. The magnetic storage cells are typically located at the intersections of bit lines and word lines. In order to program a particular magnetic storage cell, write currents are driven through both the word line and the bit line associated with a particular magnetic storage cell. A current in only one of the word line or bit line is insufficient to write to the cell. However, in combination, the current provide a sufficient magnetic field to program the MTJ stack as desired.

Although such a conventional MRAM functions, one of ordinary skill in the art will readily recognize that such a conventional MRAM may inadvertently write to nearby cells. Consequently, conventional word lines may be segmented. In such a conventional MRAM, a conventional global word line is coupled through a switch, such as a transistor, to each word line segment. A number of magnetic storage cells, and thus a number of bits, are associated with each segment. As discussed above, a bit line is orthogonal to the segment at each magnetic storage cell. Typically, eight or sixteen bits are associated with each segment in a conventional MRAM having segmented word lines. In a conventional MRAM having segmented word lines, a programming current is provided only to a particular segment of the word line during writing. As a result, the possibility of inadvertently writing to cells not associated with the segment is substantially reduced.

Although the conventional MRAM having segmented word lines can function, one of ordinary skill in the art will readily recognize that such MRAM typically employ separate read and write word lines. Thus, two word lines are associated with each word line segment. This additional line increases the space required for each storage cell. Consequently, a single word line is desired for each cell. However, combining the read word line and the write word line in a conventional MRAM causes the isolation transistors for a particular storage cell to be on during the write operation. Consequently, a high current path from the bit line through the MTJ in the storage cell to ground is established. The high current may damage the MTJ. As a result, reliability of the MRAM is adversely affected.

FIG. 1 depicts another conventional MRAM 10 having storage cells 12. Each storage cell 12 includes a conventional MTJ 14, a conventional isolation transistor 16, and a conventional adaptive voltage source 18. Conventional word lines 30 and 32 are combined read and write word lines. The conventional bit lines 20, 22, 24, and 26 are also used. The current source/sink 42 provides current to the appropriate lines based upon the states of the conventional transistors 44 and 46. The conventional word line segments 54, 56, 58, and 60 receive current based upon the state of the conventional word line select transistors 34, 36, 38, and 40. Conventional return lines 50 and 51 are also depicted. In operation, the conventional adaptive voltage source 18 can be used to provide a voltage, $V_W$, during a write operation. Consequently, the generation of the high current path through the MTJ 14 is avoided.

Although the conventional MRAM 10 functions, one of ordinary skill in the art will readily recognize that it is desirable to eliminate the conventional adaptive voltage source 18. It is also still desirable to reduce the size of the MRAM storage cells 12 and, therefore, increase the density of the MRAM. Moreover, it is also desired to utilize segmented word lines to reduce the inadvertent writing to memory cells not associated with a word line segment.

Accordingly, what is needed is a system and method for providing a MRAM that is capable of having a reduced cell size while utilizing word line segments. The present invention addresses such a need.

SUMMARY OF THE INVENTION

The present invention provides a method and system for providing a magnetic memory including magnetic memory cells associated with a word line segment is disclosed. The magnetic memory cell comprises a magnetic storage device and an isolation device. The isolation device is coupled to the magnetic tunneling junction and with a combined word line for reading and writing to the magnetic memory cell. The magnetic storage device and the isolation device are configured such that no direct current path to ground exists during the writing to the magnetic memory cell. In one aspect, in a write mode, the combined word line associated with the word line segment and the word line segment are activated. In the read mode, at least a portion of the memory cells associated with the word line segment are selected using the combined word line.

According to the system and method disclosed herein, the present invention provides a method for decreasing the size of magnetic memory cells in a magnetic memory employing word line segments.

DETAILED DESCRIPTION OF THE INVENTION

The present invention relates to an improvement in magnetic memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing a magnetic memory including magnetic memory cells associated with a word line segment is disclosed. The magnetic memory cell comprises a magnetic storage device and an isolation device. The isolation device is coupled to the magnetic tunneling junction and with a combined word line for reading and writing to the magnetic memory cell. The magnetic storage device and the isolation device are configured such that no direct current path to ground exists during the writing to the magnetic memory cell. In one aspect, in a write mode, the combined word line associated with the word line segment and the word line segment are activated. In the read mode, at least a portion of the memory cells associated with the word line segment are selected using the combined word line.

The present invention will be described in terms of particular types of magnetic memory cells, particular materials and a particular configuration of elements. However, one of ordinary skill in the art will readily recognize that this method and system will operate effectively for other magnetic memory cells, and other materials and configurations non inconsistent with the present invention.

Figure 1:
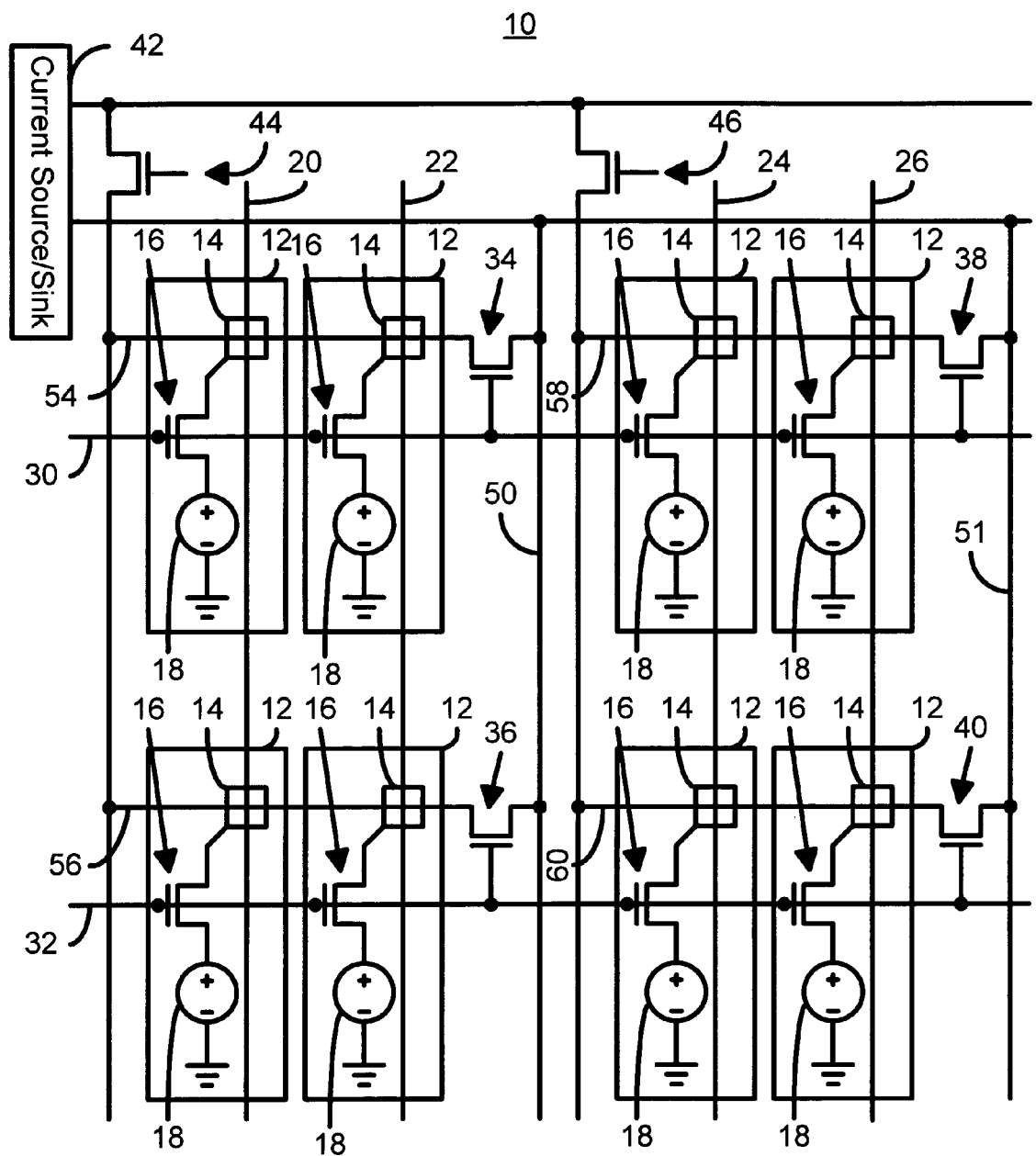
FIG. 1 is a diagram depicting a conventional MRAM having segmented word lines.
Figure 2:
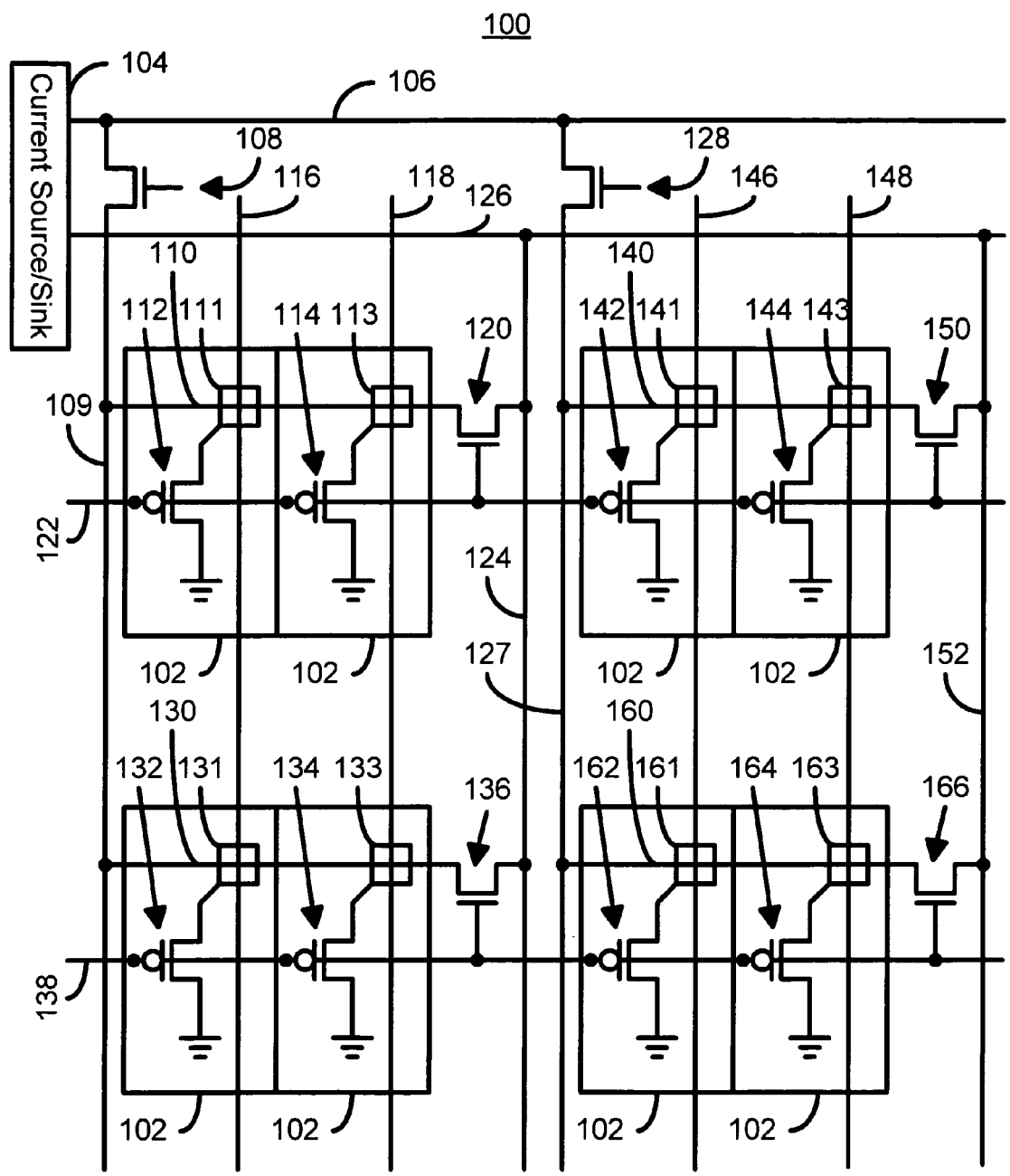
FIG. 2 is a diagram depicting one embodiment of a magnetic memory in accordance with the present invention having segmented word lines and combined read/write word lines.

To more particularly illustrate the method and system in accordance with the present invention, refer now to FIG. 2, depicting one embodiment of a magnetic memory 100 in accordance with the present invention having segmented word lines and combined read/write word lines. The magnetic memory 100 includes memory word line segments 110, 130, 140, and 160, selected by selection devices that are preferably transistors 120, 136, 150, and 166, respectively. Each word line segment 110, 130, 140, and 160 also has two storage cells 102 associated with it. Note that in another embodiment, a different number of storage cells 102 may be associated with a word line segment 110, 130, 140, and 160. Each storage cell 102 includes a magnetic storage device 111, 113, 131, 133, 141, 143, 161, and 163 and an isolation device 112, 114, 132, 134, 142, 144, 162, and 164, respectively. The isolation devices 112, 114, 132, 134, 142, 144, 162, and 164 are preferably isolation transistors 112, 114, 132, 134, 142, 144, 162, and 164, respectively. Each magnetic storage device 111, 113, 131, 133, 141, 143, 161, and 163 is preferably a MTJ. The magnetic storage devices 111, 113, 131, 133, 141, 143, 161, and 163 and the isolation devices 112, 114, 132, 134, 142, 144, 162, and 164 are configured such that there is no current path to ground through the storage devices 111, 113, 131, 133, 141, 143, 161, 163 during writing. As used herein, no current path through the magnetic storage devices 111, 113, 131, 133, 141, 143, 161, and 163 to ground can simply mean that any current through and any voltage drops on the lines to ground through the magnetic storage devices 111, 113, 131, 133, 141, 143, 161, and 163 are sufficiently small to preclude damage to the magnetic storage devices 111, 113, 131, 133, 141, 143, 161, and 163. The magnetic memory 100 includes a current source/sink 104 coupled to the storage cells 102 through lines 106, 109, 124, 127, 126, and 152 as well as through selection transistors 108 and 128. The magnetic memory 100 also includes combined word lines 122 and 138. The combined word lines 122 and 138 function as read and write word lines.

The isolation transistors 112, 114, 132, 134, 142, 144, 162, and 164 and selection transistors 120, 136, 150, and 166 are configured such that when one is switched on, the other is switched off. The isolation transistors 112, 114, 132, 134, 142, 144, 162, and 164 are of a different type than the selection transistors 120, 136, 150, and 166. In particular, the isolation transistors 112, 114, 132, 134, 142, 144, 162, and 164 have an opposite polarity from the selection transistors 120, 136, 150, and 166. In the magnetic memory 100, the isolations transistors 112, 114, 132, 134, 142, 144, 162, and 164 are P channel transistors, while the selection transistors 120, 136, 150, and 166 are N channel transistors. The isolation transistors 112, 114, 142, and 144 and isolation transistors 132, 134, 162, and 164 and selection transistors 120 and 150 and selection transistors 136 and 166, respectively, have their gates coupled to the same combined word line 122 and 138, respectively. As a result, when the isolation transistors 112, 114, 142, and 144 are turned on, the selection transistors 120 and 150 are turned off. Similarly, when the isolation transistors 132, 134, 162, and 164 are turned on, the selection transistors 136 and 166 are turned off. Likewise, when the selection transistors 120 and 140 are turned on, the isolation transistors 112, 114, 142, and 144 are turned off. Similarly, when the selection transistors 136 and 166 are turned on, the isolation transistors 132, 134, 162, and 164 are turned off. As a result, there is no current path to ground through the MTJ 111, 113, 131, 133, 141, 143, 161, and 163 during writing.

Operation of the magnetic memory 100 is described in the context of writing to one of the MTJs 111 and 113. However, other storage cells 102 function in an analogous manner. During writing, the combined word line 122 is high. Consequently, the isolation transistors 112 and 114 are in an off state. The word line selection transistor 120 is, however, on. A write current is also driven through the bit lines 116 and/or 118. Thus, data are written to the MTJs 111 and 113. During reading, the combined word line 122 is low. Consequently, isolation transistors 112 and 114 are on, while the selection transistor 120 is off. A current to ground can be driven through the MTJs 111 and 113 and the states of the MTJs 111 and 113 read.

Because of the relationship between the isolation transistors 112, 114, 132, 134, 142, 144, 162, and 164 and the selection transistors 120, 136, 150, and 166, there is no current path through the bit line, MTJs 111, 113, 131, 133, 141, 143, 161, and 163 and isolation transistors 112, 114, 132, 134, 142, 144, 162, and 164 to ground during writing. Consequently, the MTJs 111, 113, 131, 133, 141, 143, 161, and 163 are protected from damage during writing. Similarly, because the selection transistors 120, 136, 150, and 166 are off during reading, their presence and the use of the word line segments 110, 130, 150, and 160 do not affect reading. As a result, the magnetic memory 100 can utilize combined word lines 122 and 138 for both reading and writing without adversely affecting performance of the magnetic memory 100. The storage cell 102 size of the magnetic memory 100 can thus be shrunk and the magnetic memory 100 made of higher density.

Figure 3:
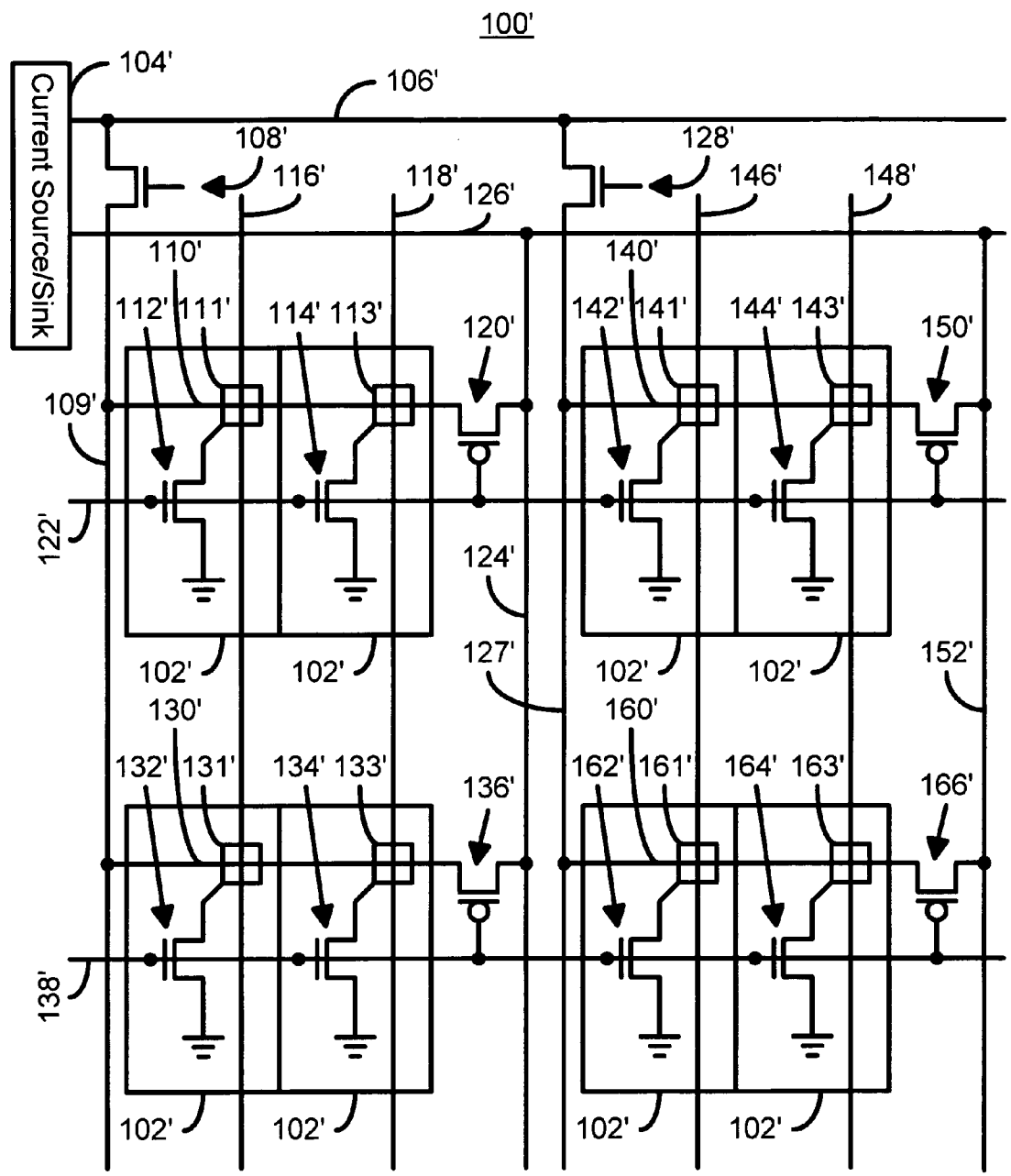
FIG. 3 is a diagram depicting a second embodiment of a magnetic memory in accordance with the present invention having segmented word lines and combined read/write word lines.

FIG. 3 is a diagram depicting a second embodiment of a magnetic memory 100' in accordance with the present invention having segmented word lines and combined read/write word lines. Components of the magnetic memory 100' are analogous to those of the magnetic memory 100 depicted in FIG. 2. Consequently, portions of the magnetic memory 100' are labeled similarly to the magnetic memory 100. For example, the magnetic memory 100' includes storage cells 102'; isolation transistors 112', 114', 132', 134', 142', 144', 162', and 164'; the selection transistors 120', 136', 150', and 166'; word line segments 110', 130', 140', and 160'; and combined word lines 122' and 138'. The magnetic storage devices 111', 113', 131', 133', 141', 143', 161', 163' and the isolation devices 112', 114', 132', 134', 142', 144', 162', and 164' are configured such that there is no current path to ground through the storage devices 111', 113', 131'. 133', 141', 143', 161', and 163' during writing. As used herein, no current path through the magnetic storage devices 111', 113', 131', 133', 141', 143', 161', and 163' to ground can simply mean that any current through and any voltage drops on the lines to ground through the magnetic storage devices 111', 113', 131', 133', 141', 143', 161', and 163' are sufficiently small to preclude damage to the magnetic storage devices 111', 113', 131', 133', 141', 143', 161', and 163'.

The isolation transistors 112', 114', 132', 134', 142', 144', 162', and 164' and selection transistors 120', 136', 150', and 166' are configured such that when one is switched on, the other is switched off. As in the memory 100, in the memory 100', the isolation transistors 112', 114', 132', 134', 142', 144', 162', and 164' are of a different type than the selection transistors 120', 136', 150', and 166'. In particular, the isolations transistors 112', 114', 132', 134', 142', 144', 162', and 164' are N-channel transistors, while the selection transistors 120', 136', 150', and 166' are P channel transistors. The isolation transistors 112', 114', 142', and 144' and isolation transistors 132', 134', 162', and 164' and the selection transistors 120' and 150' and selection transistors 136'and 166', respectively, have their gates coupled to the same combined word line 122' and 138', respectively. As a result, when the isolation transistors 112', 114', 142', and 144' are turned on, the selection transistors 120' and 150' are turned off. Similarly, when the isolation transistors 132', 134', 162', and 164' are turned on, the selection transistors 136' and 166' are turned off. Likewise, when the selection transistors 120' and 140' are turned on, the isolation transistors 112', 114', 142', and 144' are turned off. Similarly, when the selection transistors 136' and 166' are turned on, the isolation transistors 132', 134', 162', and 164' are turned off. As a result, there is no current path to ground through the MTJ 111', 113', 131', 133', 141', 143', 161', and 163' during writing.

Operation of the magnetic memory 100' is described in the context of writing to one of the MTJs 111' and 113'. However, other storage cells 102' function in an analogous manner. During writing, the combined word line 122' is low. Consequently, the isolation transistors 112' and 114' are in an off state. The word line selection transistor 120' is, however, on. A write current is also driven through the bit lines 116' and/or 118'. Thus, data are written to the MTJs 111' and 113'. During reading, the combined word line 122' is high. Consequently, isolation transistors 112' and 114' are on, while the selection transistor 120' is off. A current to ground can be driven through the MTJs 111' and 113' and the states of the MTJs 111' and 113' read.

Because of the relationship between the isolation transistors 112', 114', 132', 134', 142', 144', 162', and 164' and the selection transistors 120', 136', 150', and 166', there is no current path through the bit line, MTJs 111', 113', 131', 133', 141', 143', 161', and 163' and isolation transistors 112', 114', 132', 134', 142', 144', 162', and 164' to ground during writing. Consequently, the MTJs 111', 113', 131', 133', 141', 143', 161', and 163' are protected from damage during writing. Similarly, because the selection transistors 120', 136', 150', and 166' are off during reading, their presence and the use of the word line segments 110', 130', 150', and 160' do not affect reading. As a result, the magnetic memory 100' can utilize combined word lines 122' and 138' for both reading and writing without adversely affecting performance of the magnetic memory 100'. The storage cell 102' size of the magnetic memory 100' can thus be shrunk and the magnetic memory 100' made of higher density.

Figure 4:
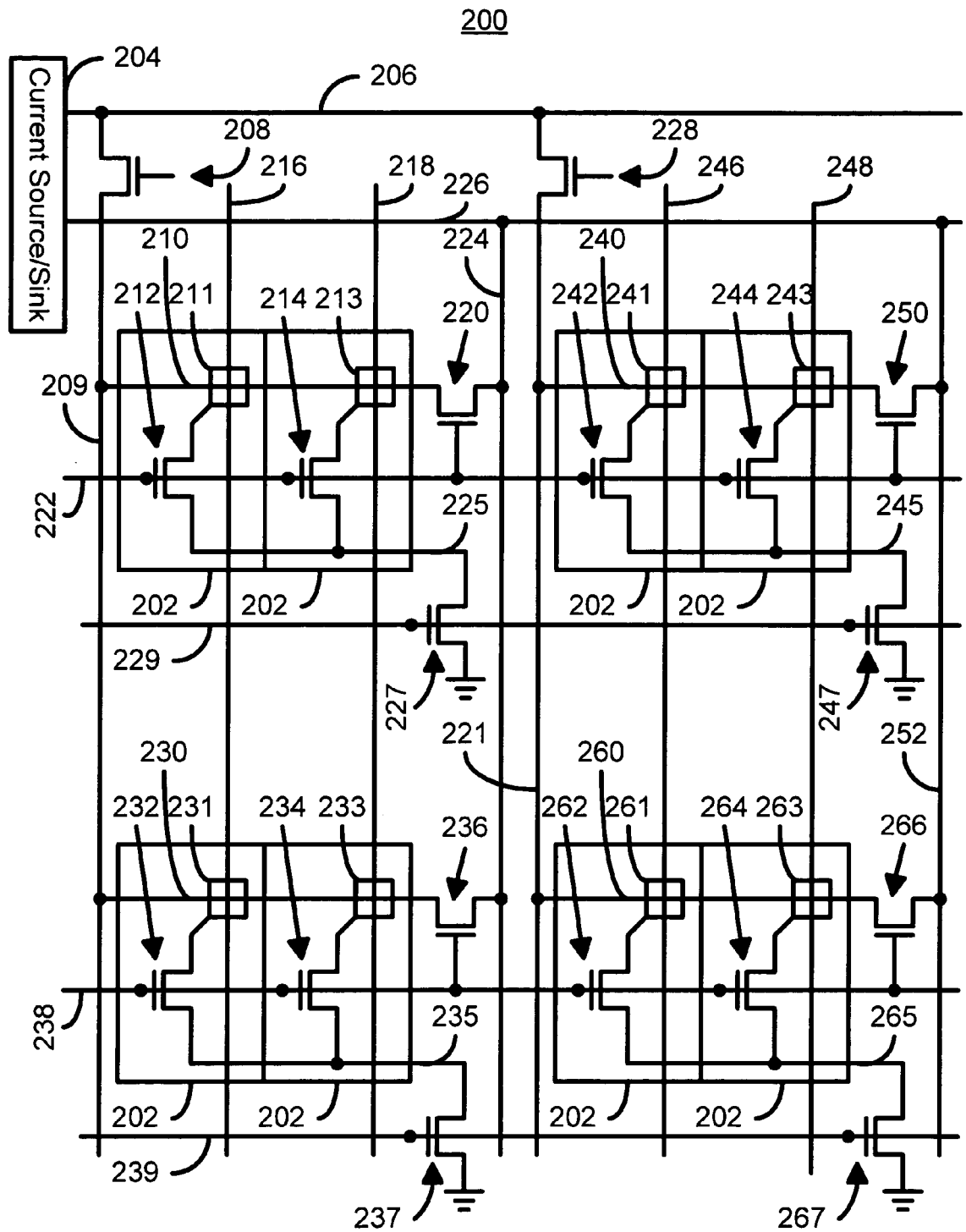
FIG. 4 is a diagram depicting a third embodiment of a magnetic memory in accordance with the present invention having segmented word lines and combined read/write word lines.

FIG. 4 is a diagram depicting a third embodiment of a magnetic memory 200 in accordance with the present invention having segmented word lines and combined read/write word lines. The magnetic memory 200 includes memory word line segments 210, 230, 240, and 260, selected by selection devices that are preferably transistors 220, 236, 250, and 266, respectively. Each word line segment 210, 230, 240, and 260 also has two storage cells 202 associated with it. Note that in another embodiment, a different number of storage cells 202 may be associated with a word line segment 210, 230, 240, and 260. Each storage cell 202 includes a magnetic storage device 211, 213, 231, 233, 241, 243, 261, and 263 and an isolation device 212, 214, 232, 234, 242, 244, 262, and 264, respectively. The isolation devices 212, 214, 232, 234, 242, 244, 262, and 264 are preferably isolation transistors 212, 214, 232, 234, 242, 244, 262, and 264, respectively. Each magnetic storage device 211, 213, 231, 233, 241, 243, 261, and 263 is preferably a MTJ. The magnetic storage devices 211, 213, 231, 233, 241, 243, 261, 263 and the isolation devices 212, 214, 232, 234, 242, 244, 262, and 264 are configured such that there is no current path to ground through the MTJs 211, 213, 231, 233, 241, 243, 261, 263 during writing. As used in this context, no current path through the MTJs 211, 213, 231, 233, 241, 243, 261, and 263 to ground simply means that any current through and any voltage drops on the lines to ground through the MTJs 211, 213, 231, 233, 241, 243, 261, and 263 are sufficiently small to preclude damage to the MTJs 211, 213, 231, 233, 241, 243, 261, and 263. The magnetic memory 200 includes a current source/sink 204 coupled to the storage cells 202 through lines 206, 209, 221, 224, 226, and 252 as well as through selection transistors 208 and 228. The magnetic memory 100 also includes combined word lines 222 and 238. The combined word lines 222 and 238 function as read and write word lines.

As mentioned above, the MTJs 211, 213, 231, 233, 241, 243, 261, 263 and the isolation transistors 212, 214, 232, 234, 242, 244, 262, and 264 are configured such that there is no current path to ground through the MTJs 211, 213, 231, 233, 241, 243, 261, 263 during writing. This is accomplished using local Vss lines 225, 235, 245 and 265, which is coupled to ground through ground selection devices 227, 237, 247, and 267, respectively. The ground selection devices 227, 237, 247, and 267 are preferably transistors 227, 237, 247, and 267, respectively. In the memory 200, the transistors 227, 237, 247, and 267 have the same type as the isolation transistors 212, 214, 232, 234, 242, 244, 262, and 264 and the selection transistors 220, 236, 250, and 266. Thus, the transistors 227, 237, 247, and 267 are preferably N channel transistors. The sources of the isolation transistors 212 and 214, 232 and 234, 242 and 244, and 262, and 264 are coupled to the Vss lines 225, 235, 245, and 265, respectively. The gates of the transistors 227 and 247 and 237 and 267 are connected to ground selection line 229 and 239, respectively. Thus, based upon the states of the transistors 227, 237, 247, and 267, the Vss lines 225, 235, 245, and 265, respectively, may float or be connected to ground. As a result, a current path to ground through the MTJs 211, 213, 231, 233, 241, 243, 261, and 263 can be blocked during writing. As used in this context, blocking of a current path through the MTJs 211, 213, 231, 233, 241, 243, 261, and 263 to ground simply means that any current through and any voltage drops on the lines to ground through the MTJs 211, 213, 231, 233, 241, 243, 261, and 263 are sufficiently small to preclude damage to the MTJs 211, 213, 231, 233, 241, 243, 261, and 263.

Operation of the magnetic memory 200 is described in the context of writing to one of the MTJs 211 and 213. However, other storage cells 202 function in an analogous manner. During writing, the combined word line 222 is high, while the ground selection line 229 is low. Consequently, the isolation transistors 212 and 214 are in an on state, but transistor 227 is in an off state. The word line selection transistor 220 is, however, on. A write current is also driven through the bit lines 216 and/or 218. Thus, data are written to the MTJs 211 and 213. Moreover, the Vss line 225 floats and eventually becomes sufficiently charged to block current through the MTJs 211 and 213 to ground. Thus, any voltage drops between various bit lines 216 and 218 and the local Vss line 225 and any current through the MTJs 211 and 213 are sufficiently small to preclude damage to the MTJs 211 and 213. Stated differently, transistor 227 being off blocks current through the MTJs 211 and 213 to ground even though isolation transistors 212 and 214 are on. During reading, the combined word line 222 and the ground selection line 229 are high. Consequently, isolation transistors 212 and 214, transistor 227, and the selection transistor 220 are on. A current to ground can be driven through the MTJs 211 and 213 and the states of the MTJs 211 and 213 read.

Because of the relationship between the isolation transistors 212, 214, 232, 234, 242, 244, 262, and 264; the transistors 227, 237, 247, and 267; and separately selectable local Vss lines 225, 235, 245, and 265, there is no current path through MTJs 211, 213, 231, 233, 241, 243, 261, and 263 and isolation transistors 212, 214, 232, 234, 242, 244, 262, and 264 to ground during writing. As a result, the magnetic memory 200 can utilize combined word lines 222 and 238 for both reading and writing without adversely affecting performance of the magnetic memory 200. Note, however, that ground selection lines 229 and 239 are added.

Figure 5:
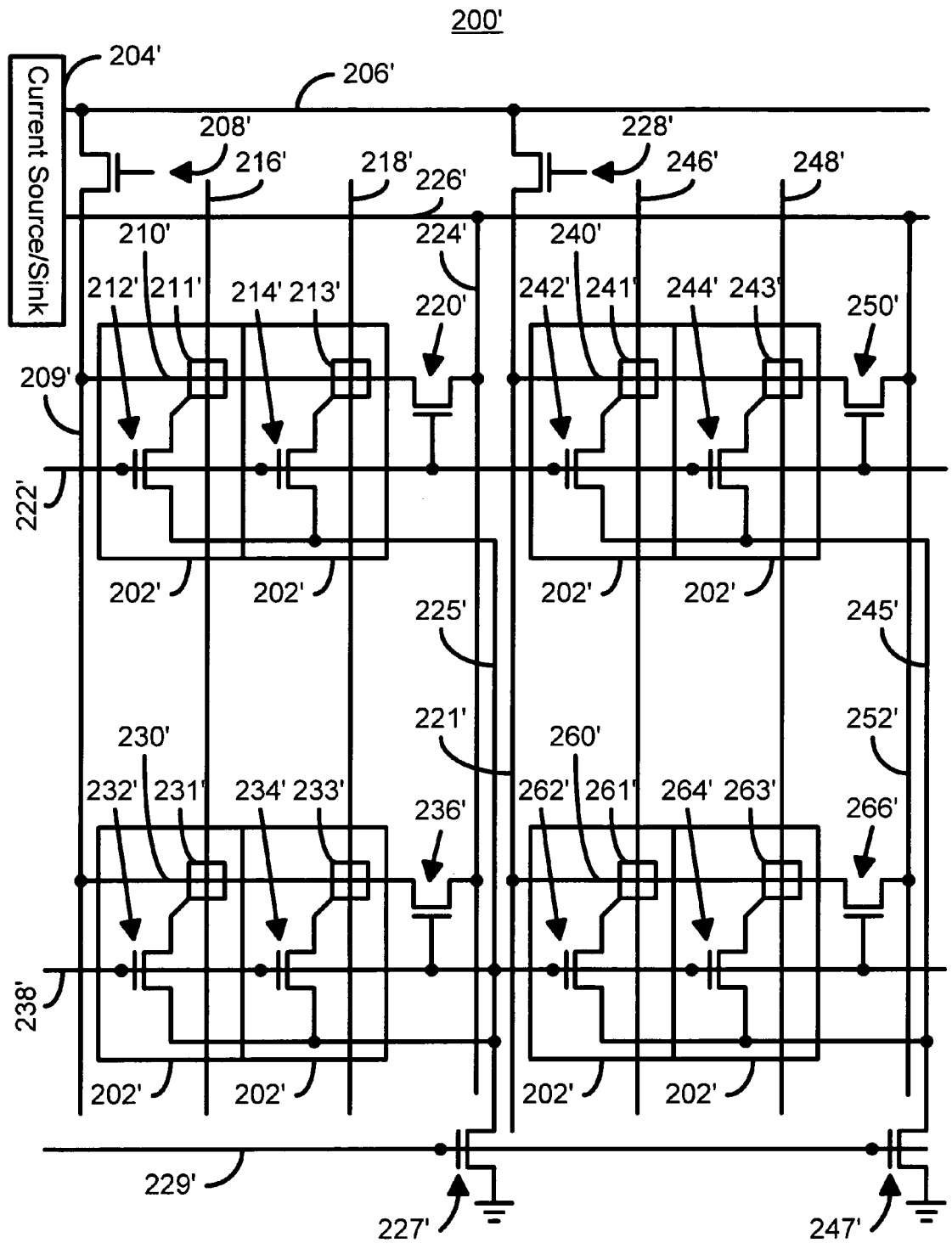
FIG. 5 is a diagram depicting a fourth embodiment of a magnetic memory in accordance with the present invention having segmented word lines and combined read/write word lines.

FIG. 5 is a diagram depicting a fourth embodiment of a magnetic memory 200' in accordance with the present invention having segmented word lines and combined read/write word lines. Components of the magnetic memory 200' are analogous to those of the magnetic memory 200 depicted in FIG. 4. Consequently, portions of the magnetic memory 200' are labeled similarly to the magnetic memory 200. For example, the magnetic memory 200' includes storage cells 202'; isolation transistors 212', 214', 232', 234', 242', 244', 262', and 264'; the selection transistors 220', 236', 250', and 266'; word line segments 210', 230', 240', and 260'; and combined word lines 222' and 238'. However, only two ground selection devices 227' and 247', two local Vss lines 225' and 245', and one ground selection line 229' are used. The magnetic storage devices 211', 213', 231', 233', 241', 243', 261', 263' and the isolation devices 212', 214', 232', 234', 242', 244', 262', and 264' are configured such that there is no current path to ground through the storage devices 211', 213', 231', 233', 241', 243', 261', and 263' during writing. Stated differently, any current through and any voltage drops on the lines to ground through the MTJs 211', 213', 231', 233', 241', 243', 261', and 263' are sufficiently small to preclude damage to the MTJs 211', 213', 231', 233', 241', 243', 261', and 263'.

Operation of the magnetic memory 200' is described in the context of writing to one of the MTJs 211' and 213'. However, other storage cells 202' function in an analogous manner. During writing, the combined word line 222' is high. The ground selection line 229' is, however, low. Consequently, the isolation transistors 212' and 214' are on while transistor 227' is off. The word line selection transistor 220' is, however, on. A write current is also driven through the bit lines 216' and/or 218'. Thus, data are written to the MTJs 211' and 213'. Moreover, the Vss line 225' floats and eventually becomes sufficiently charged to block current through the MTJs 211' and 213' to ground. Thus, any voltage drops between various bit lines 216' and 218' and the local Vss line 225' and any current through the MTJs 211' and 213' are sufficiently small to preclude damage to the MTJs 211' and 213'. Stated differently, although isolation transistors 212' and 214' are on, the current path is blocked by the transistor 227'. During reading, the combined word line 222' and the ground selection line 229' are high. Consequently, isolation transistors 212' and 214', transistors 227' and 247' and selection transistor 220' are on. A current to ground can be driven through the MTJs 211' and 213' and the states of the MTJs 211' and 213' read.

Because of the relationship between the isolation transistors 212', 214', 232', 234', 242', 244', 262', and 264'; the transistors 227' and 237'; and selectable local Vss lines 225', and 245', there is no current path through MTJs 211', 213', 231', 233', 241', 243', 261', and 263' and isolation transistors 212', 214', 232', 234', 242', 244', 262', and 264' to ground during writing. As a result, the magnetic memory 200' can utilize combined word lines 222' and 238' for both reading and writing without adversely affecting performance of the magnetic memory 200'. In addition, the number of ground selection lines, 229', that are added is reduced.

Figure 6:
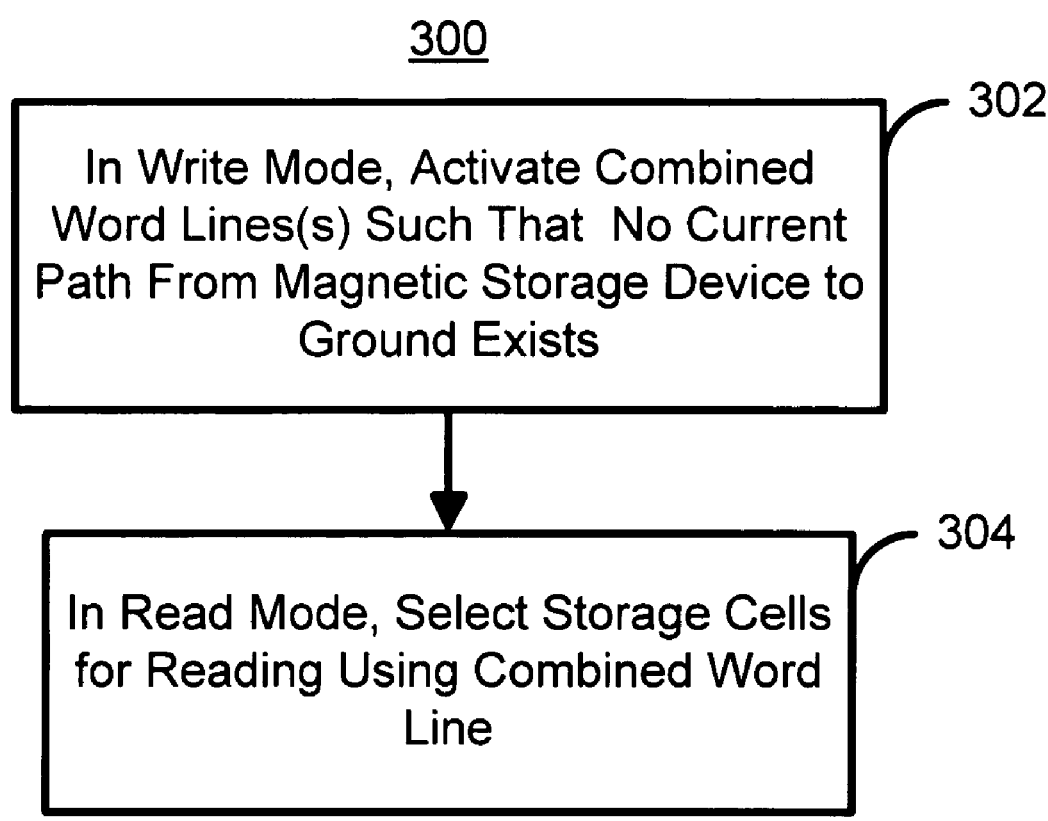
FIG. 6 is a high-level flow chart depicting one embodiment of a method in accordance with the present invention for utilizing an MRAM having segmented word lines.

FIG. 6 is a high-level flow chart depicting one embodiment of a method 300 in accordance with the present invention for utilizing an MRAM having segmented word lines. The method 300 is described in the context of the magnetic memories 100 and 200. However, one of ordinary skill in the art will readily recognize that the method 300 could be used with another magnetic memory in accordance with the present invention. In addition, the method 300 is described in the context of writing to MTJs 111 and 113 and MTJs 211 and 213. In a write mode, a combined word line 122 or 222 associated with the world line segment 110 or 210, respectively, is activated, via step 302. For the combined word lines 122 and 222, step 302 places the combined word line 122 and 222 in a high state. Note, however, that for the memory 100', the combined word line is placed in a low state. Step 302 is also carried out such that no direct current path exists between the magnetic storage devices 111, 113; 211, and 213; the isolation devices 112, 114, 212, and 214; and ground. In a preferred embodiment, this means that the isolation devices 112, 114, 212, and 214, selection transistors 120 or 220 or, in an alternate embodiment, the Vss line 225 and associated transistor 227 and ground selection line 229 are configured in a manner analogous to shown in FIGS. 2–5.

In a read mode, the storage cells 102 to be read, for example including MTJs 111 and 113 or 211 and 213 are selected using the combined word line 122 or 222, respectively, via step 304.

Thus, using the method 300, the magnetic memories 100, 100', 200, or 200' can be utilized. Further, during writing in step 302 there is no current path through MTJs 111 and 113 or 211 and 213 to ground. In addition, the combined word lines and the associated word line segments can be used in step 304 during reading without adversely affecting performance of the magnetic memory. Consequently, the method 300 and magnetic memories 100, 100', 200, and 200' can be used to reduce the cell size of a magnetic memory having segmented word lines.

A method and system has been disclosed for reducing the cell size of a magnetic memory utilizing combined read/write word lines and segmented word lines. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic memory cell associated with a word line segment comprising:
   a magnetic storage device;
   an isolation device coupled to the magnetic storage device and with a combined word line for reading and writing to the magnetic memory cell;
   the magnetic storage device and the isolation device being configured such that no direct current path to ground exists during the writing to the magnetic memory cell;
   wherein the isolation device is a first type, wherein the word line segment is selectable using a selection device, the isolation device being a first type the selection device being a second type different from the first type, the isolation device and the selection device being configured such that the isolation device being on turns off the selection device.

2. The magnetic memory cell of claim 1 wherein the isolation device is an isolation transistor, and wherein the selection device is a selection transistor.

3. The magnetic memory cell of claim 2 wherein the first type is a P-channel and the second type is N-channel.

4. The magnetic memory cell of claim 2 wherein the first type is a N-channel and the second type is P-channel.

5. The magnetic memory cell of claim 1 wherein the isolation device is an isolation transistor including a drain coupled to the magnetic storage device, a gate coupled to the combined word line and a source coupled with a Vss line, the Vss line capable of floating or being coupled to ground.

6. The magnetic memory cell of claim 5 wherein the Vss line is coupled with a transistor having a source, a drain, and a gate, the source being coupled with the Vss line, the drain being coupled with ground, and the gate being coupled with a line for selectively coupling the Vss line to the ground.

7. The magnetic memory cell of claim 1 wherein the magnetic storage device is a magnetic tunneling junction.

8. A magnetic memory comprising:
   a plurality of memory cells associated with a word line segment, each of the plurality of memory cells including at least a magnetic storage device and an isolation device coupled to the magnetic storage device;
   a combined word line associated with the word line segment, the combined word line for reading and writing to the plurality of memory cells;
   the magnetic storage device and the isolation device of each of the plurality of memory cells being configured such that no direct current path to ground exists during the writing to each of the plurality of magnetic memory cells;
   wherein the isolation device is a first type, wherein the word line segment is selectable using a selection device, the isolation device being a first type, the selection device being a second type different from the first types the isolation device and the selection device being configured such that the isolation device being on turns off the selection device.

9. The magnetic memory of claim 8 wherein the isolation device is an isolation transistor, and wherein the selection device is a selection transistor.

10. The magnetic memory of claim 9 wherein the first type is a P-channel and the second type is N-channel.

11. The magnetic memory of claim 9 wherein the first type is a N-channel and the second type is P-channel.

12. The magnetic memory of claim 8 wherein the isolation device is an isolation transistor including a drain coupled to the magnetic storage device, a gate coupled to the combined word line and a source coupled with a Vss line, the Vss line capable of floating or being coupled to ground.

13. The magnetic memory of claim 12 wherein the Vss line is coupled with a transistor having a source, a drain, and a gate, the source being coupled with the Vss line, the drain being coupled with ground, and the gate being coupled with a line for selectively coupling the Vss line to the ground.

14. The magnetic memory of claim 8 wherein the magnetic storage device is a magnetic tunneling junction.

15. A method for utilizing a magnetic memory including a word line segment, and a plurality of memory cells associated with the word line segment, each of the plurality of memory cells including at least a magnetic storage device and an isolation device coupled to the magnetic storage device, the method comprising:
   (a) in a write mode, activating a combined word line associated with the world line segment and the word line segment, the combined word line for reading and writing to a the plurality of memory cells, the word line segment and the combined word line being activated and the magnetic storage device and the isolation device of each of the plurality of memory cells being configured such that no direct current path to ground exists during the writing to each of the plurality of magnetic memory cells;
   (b) in a read mode, selecting at least a portion of the plurality of memory cells using the combined word line;
   wherein the isolation device is a first type, wherein the word line segment is selectable using a selection device, the isolation device being a first type, the selection device being a second type different from the first type, the isolation device and the selection device being configured such that the isolation device being on turns off the selection device.

16. The method of claim 15 wherein the isolation device is an isolation transistor, and wherein the selection device is a selection transistor.

17. The method of claim 16 wherein the first type is a P-channel and the second type is N-channel.

18. The method of claim 16 wherein the first type is a N-channel and the second type is P-channel.

19. The method of claim 15 wherein the isolation device is an isolation transistor including a drain coupled to the magnetic storage device, a gate coupled to the combined word line and a source coupled with a Vss line, the Vss line capable of floating or being coupled to ground.

20. The method of claim 19 wherein the Vss line is coupled with a transistor having a source, a drain, and a gate, the source being coupled with the Vss line, the drain being coupled with ground, and the gate being coupled with a line for selectively coupling the Vss line to the ground.

21. The method of claim 15 wherein the magnetic storage device is a magnetic tunneling junction.

* * * * *